United States Patent
Tolonen et al.

(10) Patent No.: US 7,417,564 B2
(45) Date of Patent: Aug. 26, 2008

(54) ENHANCING CHARACTER INPUT IN ELECTRONIC DEVICE

(75) Inventors: Pertti Tolonen, Vantaa (FI); Kimmo Koli, Helsinki (FI)

(73) Assignee: Nokia Corporation, Espoo (FI)

( * ) Notice: Subject to any disclaimer, the term of this patent is extended or adjusted under 35 U.S.C. 154(b) by 545 days.

(21) Appl. No.: 11/146,949

(22) Filed: Jun. 7, 2005

(65) Prior Publication Data

US 2006/0187089 A1  Aug. 24, 2006

(30) Foreign Application Priority Data

Jun. 29, 2004  (FI)  .................................. 20045250

(51) Int. Cl.
*H03M 11/00* (2006.01)
(52) U.S. Cl. ................ 341/22; 379/433.06; 379/433.07
(58) Field of Classification Search .................. 341/20, 341/22; 345/173; 379/433.06–433.07
See application file for complete search history.

(56) References Cited

U.S. PATENT DOCUMENTS

| 5,311,175 | A | * | 5/1994 | Waldman | ...................... 341/34 |
| 6,278,384 | B1 | | 8/2001 | Ide | |
| 6,680,677 | B1 | * | 1/2004 | Tiphane | ........................ 341/22 |
| 7,060,924 | B1 | * | 6/2006 | Beene et al. | ................. 200/512 |
| 2003/0095102 | A1 | | 5/2003 | Kraft et al. | |

FOREIGN PATENT DOCUMENTS

| EP | 1 263 195 A1 | 12/2002 |
| EP | 1 263 199 A2 | 12/2002 |
| EP | 1 324 573 A3 | 7/2003 |
| EP | 1 452 952 A1 | 9/2004 |
| GB | 2 349 725 A | 11/2000 |

* cited by examiner

*Primary Examiner*—Albert K Wong
(74) *Attorney, Agent, or Firm*—Hollingsworth & Funk, LLC

(57) ABSTRACT

The invention relates to an electronic device and a method of enhancing character input in an electronic device comprising a set of keys. The method comprises associating a group of characters with at least one key; detecting repeated presses of a key; detecting whether the key has been touched continuously during the repeated presses of the key; and interpreting the characters corresponding to the key presses in the group of characters associated with the key on the basis of the detections.

11 Claims, 3 Drawing Sheets

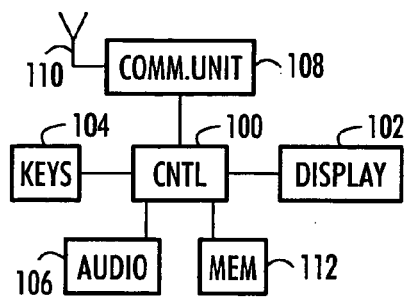
FIG. 1
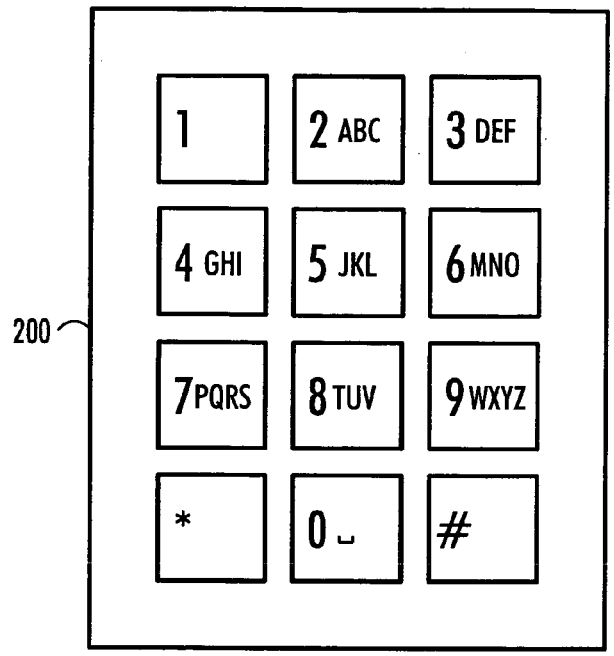
FIG. 2
| INPUT OPTION | TYPING TIME |
|---|---|
| PICK AND WAIT | 20s |
| PICK AND FIX | 5s |
| PICK AND RAISE FINGER | 3s |
FIG. 7
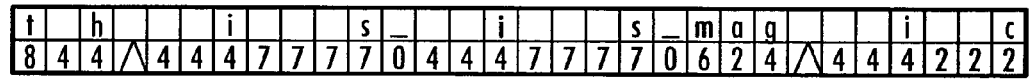
FIG. 3
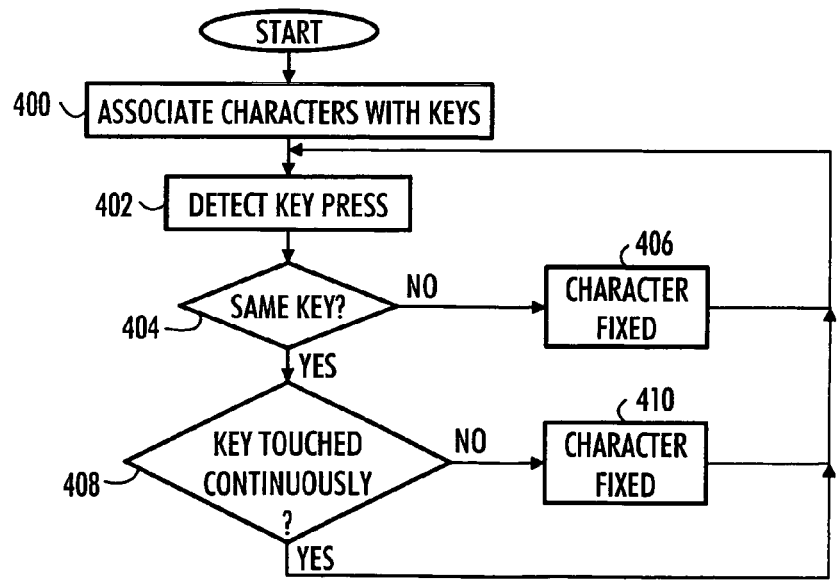
FIG. 4

ENHANCING CHARACTER INPUT IN ELECTRONIC DEVICE

FIELD

The invention relates to an electronic device comprising a set of keys and to entering characters in an electronic device.

BACKGROUND

The user interface of electronic devices comprises in many cases a keyboard with which the user may give commands to the device. A full-size typewriter keyboard is usable in devices which are of sufficient size, but in many portable devices the size of the device limits the size of the keyboard.

In prior art, the problem has been solved by introducing a touch sensitive screen which displays a miniature keyboard. A user presses the keys with a pointing device. However, this is a cumbersome solution, as it typically requires the use of both hands of the user.

Another solution presented in prior art is to reduce the number keys in the keyboard and to associate several characters with each key. For example, in mobile phones a typical keyboard comprises twelve keys intended for entering characters. Each key is associated with several different characters. The problem with this solution is to unambiguously determine the correct character when a user enters a sequence of keystrokes.

In what is called a multi-tap method, the user presses a key repeatedly to cycle through the characters associated with the key. For example, if characters 'a', 'b' and 'c' have been associated with a key and the user presses the key twice in succession, the character 'b' is selected as the correct character. The drawback of this solution is the large number of keystrokes. Another drawback is that if the next character to be typed is associated with the same key as the previous one, the user has to pause the typing for a given period of time so that the device can distinguish the characters from each other. Alternatively, the user may press a separation key, which indicates to the device that the next key presses are for the next character. Both of these solutions make the typing of characters slow.

Predictive text input solutions have also been proposed. These solutions rely on dictionaries stored in the devices. The dictionaries comprise words most commonly used in the selected language. In these solutions, the user does not select specific characters from the keys by repeatedly pressing each key. Instead, only one key press is required for each character. Each press indicates the key the particular character is associated with. The device receives the keyed sequence and compares the selected keys and their associations to the words stored in the dictionary. Thus, while the word is being written, the device proposes words that match the typed key sequence to the display of the device. If several words correspond to the typed key sequence, the user may select the correct words from the proposed alternatives.

This solution may greatly reduce the number of required keystrokes. However, the solution also has several drawbacks. The user has to be very careful all the time to select the correct word from the proposed alternatives—otherwise a totally wrong word can easily get inserted into the text. Furthermore, as the operation is based on a limited dictionary, it may be a tedious task for the user to keep on adding the missing words to the dictionary. As the number of words in the dictionary grows, there will be more and more words corresponding to a single keypad sequence, which slows down the typing procedure. The typing can also be rather cumbersome, if the text being written mixes words from several different languages. For these reasons the predictive text input has not replaced the multi-tap method, especially not among those who need to use character input repeatedly.

BRIEF DESCRIPTION OF THE INVENTION

An object of the invention is to provide an enhanced solution for character input in an electronic device. According to an aspect of the invention, there is provided a method of enhancing character input in an electronic device comprising a set of keys, the method comprising: associating a group of characters with at least one key; detecting repeated presses of a key; detecting whether the key has been touched continuously during the repeated presses of the key; interpreting the characters corresponding to the key presses in the group of characters associated with the key on the basis of the detections.

According to another aspect of the invention, there is provided a method of enhancing character input in an electronic device comprising a set of keys, the method comprising: associating a group of characters with at least one key; detecting repeated presses of a key; measuring the time interval between the key presses, during which interval the key is not touched; interpreting the characters corresponding to the key presses in the group of characters associated with the key on the basis of the time interval.

According to another aspect of the invention, there is provided an electronic device, comprising a set of keys and a controller operatively connected to the keys, the controller being configured to associate a group of characters with at least one key; detect repeated presses of a key; detect whether the key has been touched continuously during the repeated pressings of the key; interpret the characters corresponding to the key presses in the group of characters associated with the key on the basis of the detections.

According to another aspect of the invention, there is provided an electronic device, comprising a set of keys, and means for associating a group of characters with at least one key; means for detecting repeated presses of a key; means for measuring the time interval between the key presses, during which interval the key is not touched; and means for interpreting the characters corresponding to the key presses in the group of characters associated with the key on the basis of the time interval.

According to yet another aspect of the invention, there is provided a computer program product encoding a computer program of instructions for executing a computer process for enhancing character input in an electronic device comprising a set of keys, the process comprising: associating a group of characters with at least one key; detecting repeated presses of a key; detecting whether the key has been touched continuously during the repeated pressings of the key; interpreting the characters corresponding to the key presses in the group of characters associated with the key on the basis of the detections.

The invention provides several advantages. The proposed solution increases the typing speed. The solution is suitable for single-hand use. The proposed character input solution is based on a simple and intuitive principle that is easy to learn and it can be used in parallel with the conventional multi-tap method the users are familiar with.

In an embodiment, detecting whether a key has been touched continuously during the repeated pressings of the key is implemented with capacitive sensors in each key. The capacitive sensor is able to detect whether the user's finger is touching the key or not. The sensors may send the information to the controller of the device. The sensors may not have to produce any location information, and thus a simple capacitance measurement of the whole keypad may be sufficient. This reduces costs related to manufacturing the touch sensitive keys.

In an embodiment, the measurement may be performed by placing a sensor foil beneath the keyboard and by measuring the placement of the finger capacitance from the corners of this foil. This is a cost efficient approach which also provides the location information.

In an embodiment, the device may be configured to measure the time interval between the key presses during which interval the key is not touched and to interpret characters corresponding to the key presses from the characters associated with the key on the basis of the time interval.

LIST OF DRAWINGS

In the following, the invention will be described in greater detail with reference to the embodiments and the accompanying drawings, in which FIG. 1 shows an example of an electronic device of an embodiment;

FIG. 2 illustrates a section of a typical keyboard;

FIG. 3 illustrates an example of enhanced character input;

FIG. 4 is a flowchart of an embodiment of the invention;

FIG. 7 shows a table illustrating differences between different input methods.

DESCRIPTION OF EMBODIMENTS

Figure 5:
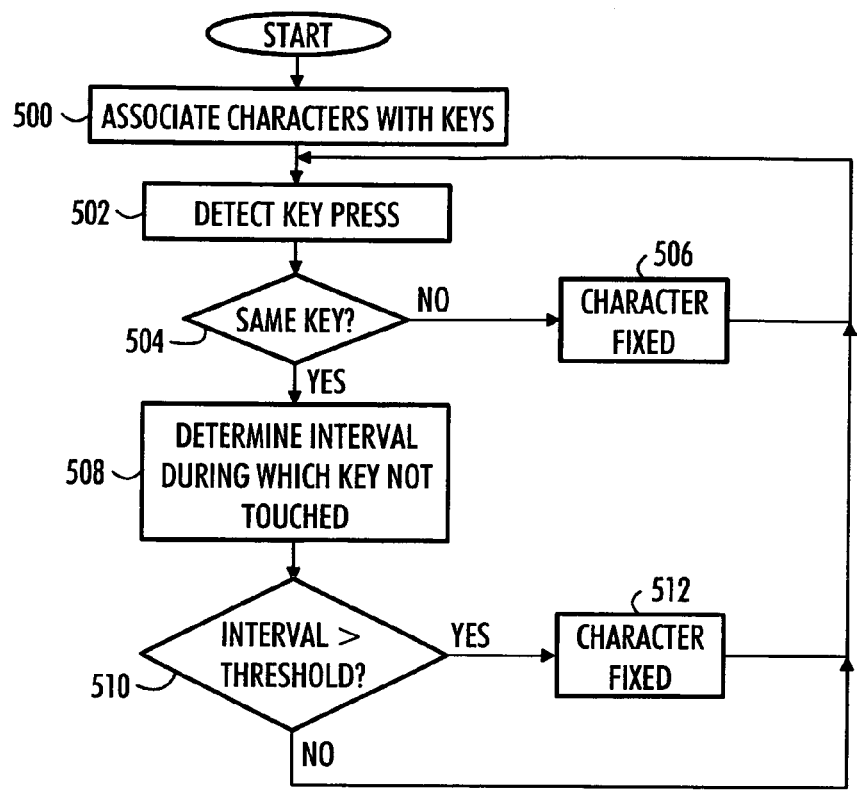
FIG. 5 is a flowchart of another embodiment of the invention.

With reference to FIG. 1, examine an example of an electronic device to which embodiments of the invention can be applied. The electronic device comprises controller 100, typically implemented with a microprocessor, a signal processor or separate components and associated software. The device further comprises a display 102. The display is typically configured to display graphics and text. The device comprises a set of keys 104. The set of keys may be realised as a keypad or keyboard. The keys are connected to the controller 100. The keys are configured to inform the controller when the key has been pressed in manners known for one skilled in the art. Depending on the type of the device, there may be different and a different number of user interface parts.

In an embodiment, the device may also comprise audio interface 106, which typically comprises a microphone and a loudspeaker, and communication means 108 implementing the functions of terminal equipment including speech and channel coders, modulators and RF parts. The device may also comprise an antenna 110. The device may also comprise a memory 112 for storing for example telephone numbers, calendar data and other user-specific data.

FIG. 2 illustrates a section of typical keyboard layout in many electronic devices such as mobile phones. The illustrated section shows the keys that are used for character input. The keyboard may also comprise other keys intended for other purposes. The illustrated section comprises 12 keys. The section comprises a key for each digit 0 . . . 9 and additional keys * and #. Each key is associated with several different characters. Keys 2 to 9 are associated with letters. Each key shows three or four most common letters beside the digit. However, the key may also have other characters associated with it.

In most cases, the key presses entered by the user of the device are intended as letters forming words. However, the associations may also define other symbols than letters, such as punctuation marks or other graphical symbols. The nature of the symbols does not have effect on the invention.

Usually, the device may have a specific input mode for entering characters. For example, if the multi-tap method is used, the key marked with digit 5 produces letter J when pressed once. If the key is pressed three times repeatedly, letter L is produced. If the key is pressed four times repeatedly, digit 5 is produced. This mode is used for entering text messages in mobile phones, for example.

In an embodiment of the invention, the keyboard or keys are equipped with sensors that detect when the user is in contact with each key. The sensors are utilised in interpreting the text the user is typing. The touch sensitive sensors may especially detect if the user is continuously in contact with a key when the user presses the key several times repeatedly. If the contact is not continuous, i.e. the user has lifted the finger from the key between the repeated pressings, the key presses before and after the lifting are interpreted to belong to different characters. Thus, raising a finger from the key between any individual key presses fixes the current character and the following key presses are interpreted to belong to the next character to be typed.

Let us study an example with reference to FIG. 3. Assume that the user wishes to enter the sentence "this is magic" by using the keypad of FIG. 2. The second row illustrates the key presses made by the user. The symbol '^' indicates moments when the user has lifted the finger from the keypad to fix the current character and to continue with an input key to give the next letter. Thus, the user presses the key 8 once to produce the letter 't'. Then, the user presses the key 4 twice in succession and lifts his/her finger from the key momentarily. The character 'h' is thus produced as the second character. The user presses the same key '4' three times and the key '7' four times and the key '0' once. This sequence produces the next characters and the first word 'this' may be seen on the screen. The rest of the sentence is produced in a similar manner.

In an embodiment, the invention comprises detecting the number of times a key was pressed while being touched continuously. The character corresponding to the key presses is selected on the basis of said number.

The flowchart of FIG. 4 illustrates an embodiment of the invention. In step 400, a group of characters is associated with the keys of the device. In practice, this step is performed at the manufacturing or programming phase of the device.

In step 402, a key press is detected in manners known to one skilled in the art. It is assumed here that a character input mode has been entered. In mobile phones, writing of short text messages is one of such modes.

In step 404, it is checked if the pressed key is the same as the previous pressed key (if such exists). If this is not the case, then the previous character is fixed 406. The newly typed key press is interpreted to belong to a new character. The procedure may return to step 402.

In step 408, the same key has been pressed successively. In this step, it is checked if the pressed key has been continuously touched between the key presses. If this is not the case, the present character is fixed 410. The newly typed key press is interpreted to belong to a new character. The procedure may return to step 402. If the user touched the key continuously, the character is not yet fixed and at least one key press is needed to determine the correct character. Thus, the procedure returns to step 402.

The flowchart of FIG. 5 illustrates another embodiment of the invention. In step 500, a group of characters is associated with the keys of the device. In practice, this step is performed at the manufacturing or programming phase of the device.

In step 502, a key press is detected in manners known to one skilled in the art. It is assumed here that a character input mode has been entered. In mobile phones, writing of short text messages is one of such modes.

In step 504, it is checked if the pressed key is the same as the previous pressed key (if such exists). If this is not the case, then the previous character is fixed 506. The newly typed key press is interpreted to belong to a new character. The procedure may return to step 502.

Step 508 comprises measuring a time interval between two successive key presses during which interval the key is not touched. This time interval may be zero if the key is touched continuously. If the user lifts the finger from the key between the key presses, the duration of this interruption is measured.

In step 510, the measured time interval is compared to a predetermined threshold. If the time interval is greater than the threshold, the previous character is fixed 512. The newly typed key press is interpreted to belong to a new character. If the time interval is smaller than the threshold, the character is not yet fixed and at least one key press is needed to determine the correct character. Thus, the procedure returns to step 502.

Figure 6A:
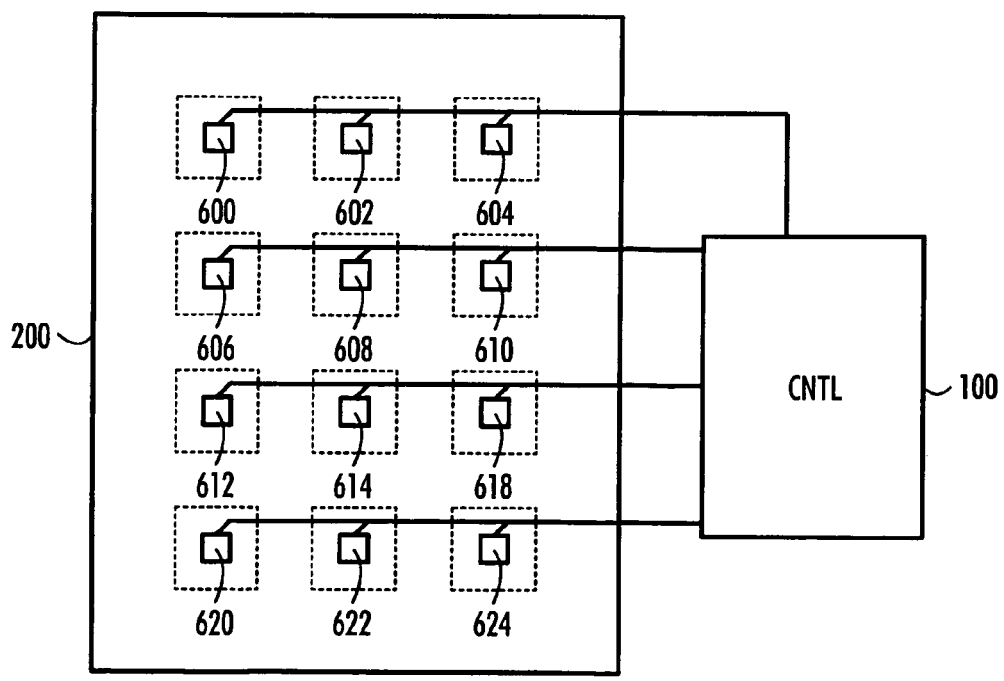
FIGS. 6A to 6C illustrate embodiments of the invention.

FIG. 6A illustrates a section of typical keyboard layout of an electronic device. In this embodiment the keyboard 200 comprises a capacitive sensor 600 to 624 for each key for detecting whether the key has been touched continuously during the repeated pressings of the key. The sensors 600 to 624 may be individually connected to the controller 100 of the device. The sensors may be configured to detect when the key is touched. The sensors may also be configured to detect when the user's finger is close to the key. A suitable threshold to distinguish between touching and not touching may be set. The controller 100 may also be configured to run a timer application to measure the length of the time interval during which keys are not touched between repeated key presses. The timer may also be realised with discrete components.

Figure 6B:
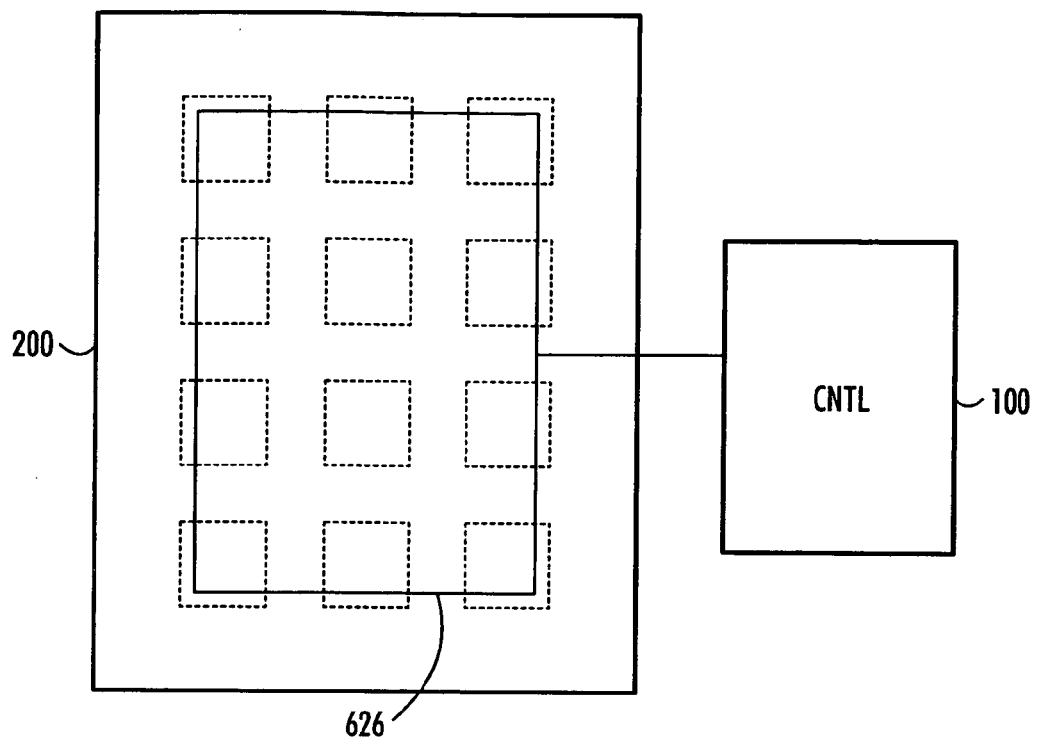

FIG. 6B illustrates another example of a section of typical keyboard layout of an electronic device. In this embodiment the keyboard 200 comprises a capacitive sensor 626 for detecting whether a key has been touched continuously during the repeated pressings of the key. The sensor is connected to the controller of the device. In this embodiment touching of different keys cannot be distinguished from each other. This is not a serious drawback, as such information is not generally needed. The controller 100 may make decisions on the basis of the information given by the single sensor.

It should be noted that location information is not necessarily required from the sensors, as would be the case with touch sensitive screens. The sensor system of the above embodiments is considerably simpler and thus cheaper to realize than touch sensitive screens, where location information about touching the screen is required.

Figure 6C:
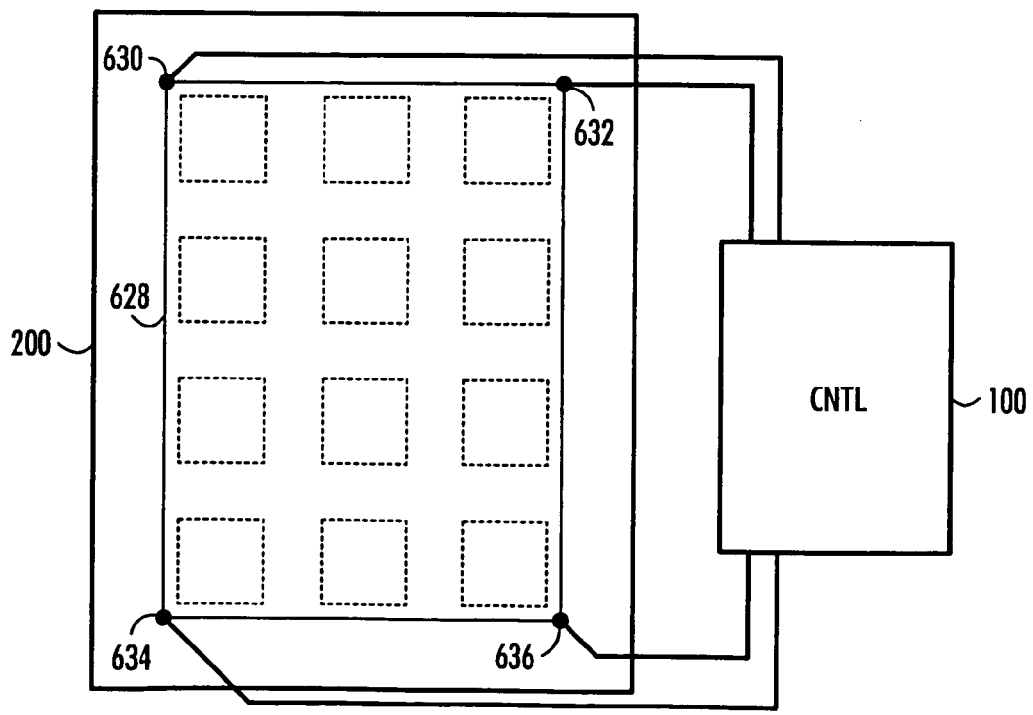

FIG. 6C illustrates another example of a section of typical keyboard layout of an electronic device. In this embodiment the device comprises a sensor foil 628 beneath the keys with the capacitance measurement points 630 to 636 in the corners. Capacitance is measured in the measurement points and touching the keypad and the location where the touching occurred may be detected.

FIG. 7 shows a table illustrating differences in the typing speed between different input methods. Assume that the user of an electronic device wishes to type ten consecutive 'a' characters (aaaaaaaaaa). This character is typically associated with the key '2'. The first row of the table shows the result when the user pauses after typing each character to be able to enter the next character by pressing the same key. The second row shows the result when the user presses a separation key after each character. The separator key, which in mobile phones is typically a down-arrow key, indicates to the device that the next key presses are for the next character. The third row shows the result when the user has lifted his/her finger from the key between the characters. Even though this example is simple and impractical, it highlights the advantages of the embodiments of the invention.

In an embodiment, the invention is realized with the aid of a computer program product encoding a computer program of instructions for executing a computer process for enhancing character input in an electronic device comprising a set of keys. The process comprises associating a group of characters with at least one key, detecting repeated presses of a key, detecting whether the key has been touched continuously during the repeated presses of the key and interpreting the characters corresponding to the key presses in the group of characters associated with the key on the basis of the detections.

Even though the invention is described above with reference to an example according to the accompanying drawings, it is clear that the invention is not restricted thereto but it can be modified in several ways within the scope of the appended claims.

The invention claimed is:

1. A method, comprising:

associating a group of characters with at least one key;

detecting at least one press of a key;

detecting whether the key has been touched continuously; and upon the detection of the absence of touch on the key determining the character to be input from the group of characters based on the number of key pressings while the key has been touched continuously.

2. The method of claim 1, wherein the characters associated with a key are in a predetermined order.

3. The method of claim 1, further comprising:

detecting the number of times a key was pressed while being touched continuously;

selecting the character corresponding to the key presses on the basis of said number.

4. The method of claim 1, further comprising detecting whether the key has been touched continuously with a capacitive sensor.

5. An electronic device, comprising:

a set of keys; and a controller operatively connected to the keys wherein the controller is configured to associate a group of characters with a first key, detect at least one press of the first key, detect whether the first key has been touched continuously during the key pressing, and upon the detection of the absence of touch on the first key determining the character to be input from the group of characters based on the number of key pressings while the first key has been touched continuously.

6. The device of claim 5, wherein the device comprises a capacitive sensor for each key for detecting whether the key has been touched continuously during the repeated pressings of the key.

7. The device of claim 5, wherein the keys of the device are in the form of a keypad and the device comprises a capacitive sensor for the keypad for detecting whether a key has been touched continuously during the repeated pressings of the key.

8. The device of claim 5, wherein the keys of the device are in the form of a keypad and the device comprises a capacitive sensor foil under the keypad for detecting whether a key has been touched continuously during the repeated pressings of the key.

9. A computer program product encoded with computer program instructions for executing a computer process for enhancing character input in an electronic device comprising a set of keys, the instructions comprising:
  associating a group of characters with at least one key;
  detecting at least one press of a key;
  detecting whether the key has been touched continuously; and
  upon the detection of the absence of touch on the key determining the character to be input from the group of characters based on the number of key pressings while the key has been touched continuously.

10. A device, operatively connected to a set of keys, the device comprising:
  means for associating a group of characters with a first key;
  means for detecting at least one press of the first key;
  means for detecting whether the first key has been touched continuously during the pressing, and upon the detection of the absence of touch on the first key determining the character to be input from the group of characters based on the number of key pressings while the first key has been touched continuously.

11. A device, operatively connected to a set of keys, the device being configured to:
  associate a group of characters with a first key;
  detect at least one press of the first key;
  detect whether the first key has been touched continuously during the pressing, and upon detection of the absence of touch on the first key to determine the character to be input from the group of characters based on the number of key pressings while the first key has been touched continuously.

* * * * *